United States Patent [19]
Linder
[11] 3,729,685
[45] Apr. 24, 1973

[54] SELF-COMPENSATED LOW VOLTAGE OPERATIONAL AMPLIFIER

[75] Inventor: Donald L. Linder, Elmhurst, Ill.
[73] Assignee: Motorola, Inc., Franklin Park, Ill.

[22] Filed: Jan. 28, 1971
[21] Appl. No.: 110,427

[52] U.S. Cl. ........................330/17, 307/320, 330/19, 330/28, 330/107
[51] Int. Cl. ................................H03f 3/18, H03f 1/36
[58] Field of Search .......................330/13, 17, 19, 28, 330/107, 109; 307/262, 320

[56] References Cited

UNITED STATES PATENTS

| | | | |
|---|---|---|---|
| 3,096,487 | 7/1963 | Lee | 330/28 X |
| 3,379,988 | 4/1968 | Graham | 330/28 X |
| 3,663,836 | 6/1970 | Fernandez-Sein | 307/262 |
| 3,214,705 | 10/1965 | Smith et al | 330/19 X |
| 3,262,061 | 7/1966 | Kahn | 330/19 X |

*Primary Examiner*—Roy Lake
*Assistant Examiner*—Lawrence J. Dahl
*Attorney*—Vincent Rauner and M. Dickler

[57] ABSTRACT

A self-compensated low voltage amplifier is provided having first, second and third transistors direct current coupled together. The first and third transistors are of a first conductivity type and the second transistor is of an opposite conductivity type. A source of supply voltage is coupled to the transistors causing them to develop operative bias voltages at the electrodes. A diode is coupled from the emitter of the third transistor to the base of the second transistors and is reverse biased by the bias voltages at the electrodes to provide a capacitive reactance between the third transistor emitter electrode and the second transistor base electrode. This capacitive reactance acts to provide a negative feedback path to the second transistor to stabilize the amplifier and prevent oscillation.

9 Claims, 3 Drawing Figures

INVENTOR:
DONALD L. LINDER
BY
Marshall N. Dickler
ATTY.

SELF-COMPENSATED LOW VOLTAGE OPERATIONAL AMPLIFIER

BACKGROUND OF THE INVENTION

Multi-stage transistor amplifiers are being designed in integrated circuit (IC) form for use as operational amplifiers (OP AMPS). OP AMP devices are adaptable for use in many applications by the addition of any one of a number of feedback circuits between the input and the output terminals, and/or by the addition of circuit components to the input or output terminals. The first requirement of a transistor amplifier designed for such use is that it will remain stable when used with a selected feedback network under the required operating conditions. That is, it will not oscillate at any frequency with the feedback network selected.

Because of the small size of integrated circuit OP AMPS it is particularly desirable to employ them in miniature products such as radio pagers. Such products are however designed to operate from a very low voltage source, such as a one cell battery. One cell batteries have a voltage range of 0.95to 1.5 volts with the voltage varying with the condition of charge. The OP AMP must be capable of stable operation at such low voltages and over the voltage range. In order to be capable of operation from a one cell battery and still provide the gain and functional operation of an operational amplifier, a multi-stage amplifier is required. Usually three stages are necessary. The number of stages required creates the possibility that oscillation will occur when some feedback network is added between the input and output terminals. Internal feedback circuits have been proposed to inhibit the possibility of such oscillation. However, these feedback circuits are normally reactive networks which cannot be manufactured in integrated circuit form.

SUMMARY OF THE INVENTION

It is an object of this invention to provide an operational amplifier for use at low supply voltages.

Another object of this invention is to provide an operational amplifier which is stable with the feedback networks which may be selected and coupled thereto.

A further object of this invention is to provide an operational amplifier whose operating characteristics are stable over a substantial voltage range.

Still another object of this invention is to provide an operational amplifier including stabilizing feedback circuits capable of being manufactured in integrated circuit form.

In practicing this invention a self-compensated low voltage amplifier is provided having first, second and third transistors direct current coupled together. The collector of the first transistor is connected to the base of the second, and the collector of the second is connected to the base of the third. The first and third transistors are NPN type, and the second is a PNP type. A source of supply voltage is coupled to the transistors causing them to develop bias voltages at the electrodes. A junction diode is coupled from the emitter of the third transistor to the base of the second transistor and is reverse biased by the bias voltages at the electrodes to provide a capacitive reactance between the third transistor emitter electrode and the second transistor base electrode. When manufactured in integrated circuit form, the size of the diode junction can be varied in order to vary the capacitive reactance of the diode. Furthermore, the capacitive reactance can be varied by variations in the reverse bias supplied to the diode. The capacitive reactance supplied by the diode acts to provide a negative feedback path to the second transistor to stabilize the amplifier and prevent oscillation when an external feedback circuit is added.

THE DRAWINGS

DETAILED DESCRIPTION OF THE DRAWINGS

Figure 1:
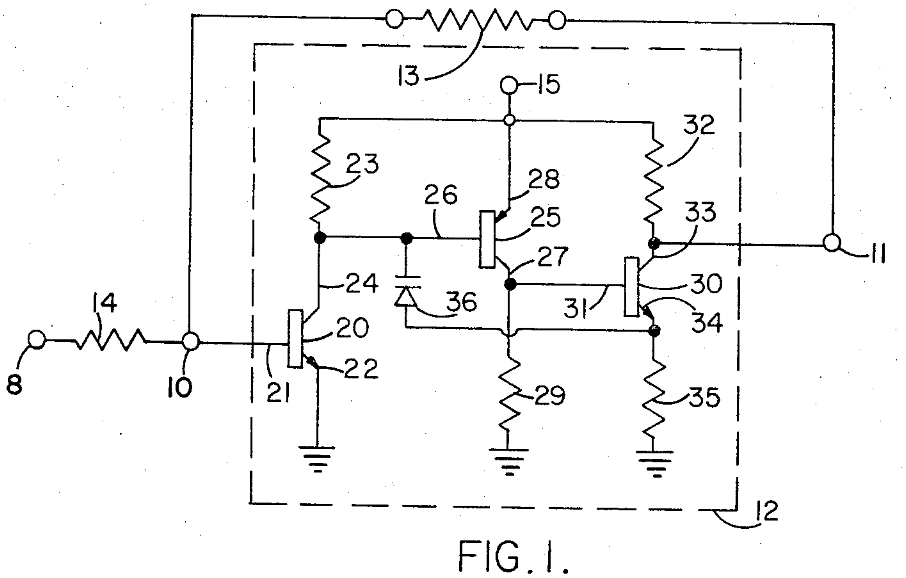
FIG. 1 is a schematic diagram of a multi-stage transistor operational amplifier employing the features of this invention.

Referring to FIG. 1 there is shown a self-compensated, low voltage, operational amplifier incorporating the features of this invention. Input signals are coupled to the amplifier at input terminal 10 from terminal 8 through input resistor 14 and output signals are coupled from the amplifier at output terminal 11. The operational amplifier portion of the circuit is shown within dashed line 12. Resistor 13 is an externally added feedback resistor, and is one of a number of possible feedback circuits that can be added between input terminal 10 and output terminal 11 of operational amplifier 12. If operational amplifier 12 is used as an inverter amplifier, such as shown in FIG. 1, the feedback circuit will include a feedback resistor such as resistor 13 and an input resistor such as resistor 14. If operational amplifier 12 is used as an integrator, the feedback circuit will include a resistor and capacitor, serially connected between input terminal 10 and output terminal 11.

A source of direct current potential is coupled to operational amplifier 12 at terminal 15. In the embodiment shown it is desirable that operational amplifier 12 be capable of operating from a one cell battery. A one cell battery has a voltage range of 0.95 to 1.5 volts. In order for amplifier 12 to provide the amplification required of an operational amplifier at this low voltage, three transistors 20, 25 and 30 are required. Resistor 14 is coupled to input terminal 10 and base 21 of transistor 20. Base 26 of transistor 25 is coupled to collector 24 of transistor 20, and base 31 of transistor 30 is coupled to collector 27 of transistor 25. The three transistors are serially, direct current coupled together. Emitter electrode 22 of transistor 20 is coupled to ground potential. Resistor 29, the collector load resistor, couples collector 27 of transistor 25 to ground potential. Resistor 35 couples emitter 34 of transistor 30 to ground potential. The one cell battery voltage at terminal 15 is directly connected to emitter 28 of transistor 25, and connected through collector load resistors 23 and 32 to collectors 24 and 33 of transistors 20 and 30, respectively. Collector 33 of transistor 30 is also connected to terminal 11, the operational amplifier output terminal.

In order to be capable of operation from a low supply voltage, the transistors are arranged with transistors 20 and 30 being of a first conductivity type, and transistor 25 being of a second conductivity type. In the embodiment shown in FIG. 1 transistors 20 and 30 are NPN type transistors, while transistor 25 is a PNP type transistor. This particular configuration allows operation from the one cell battery.

The NPN–PNP–NPN configuration is also designed to minimize operating current variations over the one cell voltage range, and over the operating temperature range. Base 26 and emitter 28 of transistor 25 are coupled to opposite ends of resistor 23, the collector load resistor of transistor 20. Base 31 of transistor 30 is coupled to one end of collector load resistor 29. Resistor 35 is coupled from emitter 34 of transistor 30 to ground potential. Collector load resistors 23 and 29 are therefore in parallel with the base-emitter junction of transistors 25 and 30, respectively. As the base-emitter junction of a transistor when forward biased is maintained at very close to a constant voltage over the voltage and temperature range, due to the characteristics of the transistor, the voltage across collector load resistors 23 and 29 will be maintained at very close to a constant voltage over the one cell voltage range and the operating temperature range. With the voltage across collector load resistors 23 and 29 constant, the current through transistors 20 and 25, and therefore the operating characteristics of these transistors will remain constant.

As previously stated, operational amplifier 12 to provide the desired gain must employ three transistor stages. A normal requirement in many operational amplifiers is that the output be inverted from, or out of phase with the input. Ideally, the phase difference should be 180° so that an external AC feedback circuit may be used with the operational amplifier. An amplifier that is to be used with an AC feedback network, such as resistor 13, must have the proper gain and phase characteristics or oscillation may occur with some one of the possible feedback circuits, or at a particular frequency. If the output of operational amplifier 12 is 180° out of phase with the input signal, negative feedback is provided through resistor 13 to input terminal 10. An additional 90° of phase shift at output terminal 11 can be tolerated without any adverse effects on the circuit performance. That is, the feedback signal can be 270° out of phase with the input signal without causing operational amplifier 12 to oscillate. If the output signal at terminal 11 is 360° out of phase with the input signal at terminal 10, it is considered positive feedback and it is possible that it will cause operational amplifier 12 to oscillate. This can occur if the gain of the feedback loop exceeds unity, and the feedback signal is positive with respect to the input signal.

Transistors 20, 25 and 30 are arranged in a circuit configuration which causes the signal at the output of each stage to be 180° out of phase with the signal at the input to that stage at low and intermediate frequencies. The signal at output terminal 11 is therefore 540° out of phase with the input signal at terminal 10. This is equivalent to a 180° phase shift.

As the frequency of the signals coupled through operational amplifier 12 increases, the inherent junction capacitance, or interelectrode capacitance, of the transistors in operational amplifier 12 all provide capacitive loading on the collectors of their respective transistors. For example, the interelectrode capacitance between collector electrode 27 and base electrode 26 of transistor 25 will create capacitive loading at collector 24. This capacitive loading will cause an additional phase shift of the signal in each stage of operational amplifier 12, and will also cause a decrease in gain in that particular stage. If the interelectrode capacitance of each transistor contributes some phase shift and attenuation at high frequencies, in addition to the 180° phase shift normally caused by each stage, the addition or undesired phase shift at output terminal 11 will rapidly exceed 180°. An additional 180° of phase shift will cause the output signal at terminal 11 to be 360° out of phase (or in phase) with the signal at input terminal 10. The signal fed back through resistor 13 is then positive feedback. As the decrease in stage amplification or attenuation caused by the interelectrode capacitance occurs much more slowly than the additional phase shift, the feedback loop gain will exceed unity and cause the operational amplifier 12 to oscillate.

To avoid the above described oscillatory condition from occurring, diode 36 is coupled from emitter 34 of transistor 30 to base 26 of transistor 25. With transistors 20, 25 and 30 arranged in the NPN–PNP–NPN configuration shown in FIG. 1, the bias voltages at the base 26 of transistor 25 and at the emitter 34 of transistor 30 are such that diode 36 is reverse biased. Diode 36 is a junction diode having a capacitive reactance characteristic when reverse biased. The amount of capacitive reactance of diode 36 is proportional to the size of the diode junction. Furthermore, the capacitance can be varied in accordance with the magnitude of the applied reverse bias. Miller multiplication of the capacitive reactance of diode 36 by transistors 25 and 30 causes operational amplifier 12 to see a capacitive reactance at base 26 which is substantially greater than the interelectrode capacitance contributed by the transistor stages. This capacitance provides a low frequency phase and attenuation characteristic which prevents the interelectrode capacitance of each stage from causing an additional phase shift.

Figures 2, 3:
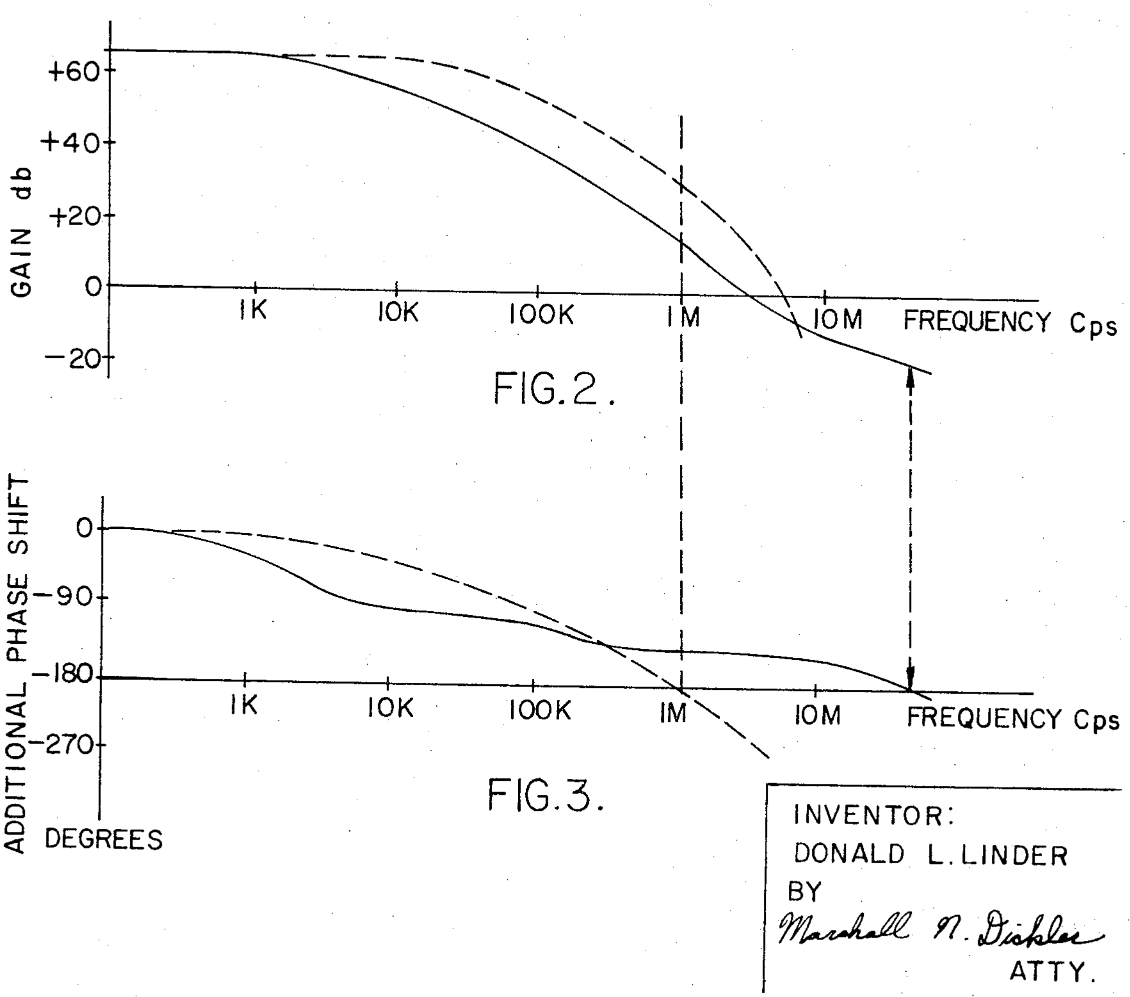
FIG. 2 is a graph illustrating the frequency vs. gain characteristics of the operational amplifier of FIG. 1.
FIG. 3 is a graph showing additional phase shift in degrees vs. frequency for the operational amplifier of FIG. 1.

Referring to FIGS. 2 and 3 there are shown curves for operational amplifier 12 when junction diode 36 has been omitted. Referring to FIG. 3, the dashed curve is shown crossing through the −180° additional phase shift point at approximately 1 megahertz. At this frequency the feedback signal is positive. Following the dashed vertical line up to FIG. 2, the dashed curve there shows the feedback loop gain to be approximately +30 db at 1 megahertz. The gain of the feedback loop at this frequency is also positive. With a positive feedback and a feedback loop gain shown by the dashed curves, operational amplifier 12 will oscillate at 1 megahertz when an external feedback circuit such as resistor 13 is added.

The solid lines in FIG. 2 and 3 show the operating characteristics of operational amplifier 12 with diode 36 included in the circuit. Referring to FIG. 3 the curve crosses the −180° additional phase shift line at approximately 30 megahertz. Following the dash line up to FIG. 2, at this point the feedback loop gain of operational amplifier 12 is −20 db, or less than unity. If the feedback loop gain is less than unity when the feedback signal coupled from terminal 11 to terminal 10 through resistor 13 is 360° out of phase with the signal coupled to terminal 10, no oscillation will occur.

The capacitive reactance added from emitter electrode 34 to base electrode 26 is therefore required to stabilize the amplifier operation and prevent oscillation when an external feedback circuit is added. Junction diode 36 provides the necessary capacitive reactance and is easily implementable in integrated circuit form, whereas discrete capacitors could not be implemented in integrated circuit form. Furthermore, the capacitance of diode 36 can be easily varied by varying the junction size in the integrated circuit, or by changing the reverse bias.

An operational amplifier constructed in accordance with the above described features may include components of the following values to provide operation such as is exemplified by the curves shown in FIGS. 2 and 3.

| | |
|---|---|
| Resistor 23 | 120K |
| Resistor 29 | 180K |
| Resistor 32 | 22K |
| Resistor 35 | 2.2K (1.2K)* |
| Transistor 20 | Silicon, NPN, small geometry, linear integrated circuit transistor |
| Transistor 25 | Silicon, lateral PNP small geometry, linear integrated circuit transistor |
| Transistor 30 | Silicon, NPN, small geometry, linear integrated circuit transistor |
| Diode 30 | Integrated circuit junction diode, capacitance of 50 pf (100 pf)* |

* asterisked items are alternate values employed where circuit is used as an inverter rather than an integrator An operational amplifier has been described which is adopted for use with a low power supply voltage such as a one cell battery. The operational amplifier will remain stable when used with many conventional feedback networks. Circuit configuration and biasing is such that the operating characteristics remain stable over the entire operating range of a one cell battery and over a substantial temperature range. Use of a reverse biased junction diode, whose junction size can be varied, provides necessary circuit stability and allows the operational amplifier to be manufactured in integrated circuit form.

I claim:

1. A transistor operational amplifier including in combination; a first transistor of a first conductivity type, a second transistor of an opposite conductivity type direct current coupled to said first transistor, a third transistor of the first conductivity type direct current coupled to said second transistor, said transistors each having base, emitter and collector electrodes, supply voltage means coupled to said transistors, said transistors developing bias voltages at said electrodes in response to the supply voltage, and diode means direct current coupled from said third transistor to said second transistor and reverse biased by the bias voltages thereat, said diode means when reverse biased developing a capacitive reactance thereacross, said capacitive reactance acting to provide a negative feedback path to said second transistor to stabilize said operational amplifier.

2. The transistor operational amplifier of claim 1 wherein said first transistor collector electrode is direct current coupled to said second transistor base electrode, and said second transistor collector electrode is direct current coupled to said third transistor base electrode.

3. The transistor operational amplifier of claim 2 wherein said diode means is coupled from said third transistor emitter electrode to said second transistor base electrode.

4. The operational amplifier of claim 3 wherein said diode means is a junction diode having a capacitance proportional to said junction size.

5. The operational amplifier of claim 4 wherein said junction diode capacitance is further variable in relation to the magnitude of said reverse bias applied thereto.

6. A transistor amplifier including in combination; first, second and third transistors direct current coupled together in cascade, said first and third transistors being of a first conductivity type and said second transistor being of an opposite conductivity type, each of said transistors having base, emitter and collector electrodes, supply voltage means coupled to said transistors, said transistors developing bias voltages at said electrodes in response to the voltage supplied thereto, diode means coupled from said emitter electrode of said third transistor to the base electrode of said second transistor and reverse biased by the bias voltages thereat for providing a capacitive reactance therebetween and a negative feedback path to said second transistor to stabilize said amplifier.

7. The transistor amplifier of claim 6 further including a first collector resistor coupled from said first transistor collector to the supply voltage means, and a second collector transistor coupled from said second transistor collector to a reference potential, said first collector resistor being coupled to said second transistor base and emitter electrodes for providing a bias voltage thereto which varies in accordance with the current variation of said first stage, said second transistor collector resistor being coupled to said third transistor base and emitter electrodes for supplying a bias voltage thereto which varies in accordance with the current of said second transistor.

8. The transistor amplifier of claim 7 wherein said diode means is a junction diode, said junction diode when reverse biased having a capacitance proportional to the junction size.

9. An operational amplifier including in combination; a plurality of transistor stages direct current coupled together in cascade and having an input and output terminal, said stages being operative to provide at least 180° phase shift for signals coupled thereto with said phase shift increasing with increasing signal frequency, feedback circuit means connected from said output terminal to said input terminal, supply voltage means coupled to said stages for supplying bias voltages thereto, and diode means direct current coupled from one stage to a previous stage and reverse biased by the bias voltages thereat, said diode means when reverse biased developing a capacitive reactance thereacross, said capacitive reactance acting to inhibit a phase shift in excess of said 180° phase shift at said output terminal.

* * * * *

UNITED STATES PATENT OFFICE
CERTIFICATE OF CORRECTION

Patent No. 3,729,685 Dated April 24, 1973

Inventor(s) Donald L. Linder

It is certified that error appears in the above-identified patent and that said Letters Patent are hereby corrected as shown below:

Column 6, Claim 7, line 4, "transistor" should read -- resistor --.

Signed and sealed this 30th day of April 1974.

(SEAL)
Attest:

EDWARD M.FLETCHER,JR.
Attesting Officer

C. MARSHALL DANN
Commissioner of Patents